(12) United States Patent
He et al.

(10) Patent No.: US 11,264,507 B2
(45) Date of Patent: Mar. 1, 2022

(54) THIN FILM TRANSISTOR AND METHOD FOR MANUFACTURING THE SAME, ARRAY SUBSTRATE AND ELECTRONIC DEVICE

(71) Applicant: BOE TECHNOLOGY GROUP CO., LTD., Beijing (CN)

(72) Inventors: Xiaolong He, Beijing (CN); Dongsheng Li, Beijing (CN); Shengguang Ban, Beijing (CN); Rui Huang, Beijing (CN); Dongcan Mi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 741 days.

(21) Appl. No.: 16/078,160

(22) PCT Filed: Dec. 12, 2017

(86) PCT No.: PCT/CN2017/115620
§ 371 (c)(1),
(2) Date: Aug. 21, 2018

(87) PCT Pub. No.: WO2018/149218
PCT Pub. Date: Aug. 23, 2018

(65) Prior Publication Data
US 2021/0193841 A1    Jun. 24, 2021

(30) Foreign Application Priority Data

Feb. 16, 2017 (CN) .......................... 201710084366.5

(51) Int. Cl.
*H01L 29/786* (2006.01)
*H01L 29/267* (2006.01)
(Continued)

(52) U.S. Cl.
CPC ...... *H01L 29/78609* (2013.01); *H01L 29/267* (2013.01); *H01L 29/45* (2013.01);
(Continued)

(58) Field of Classification Search
CPC .................................................. H01L 29/66765
See application file for complete search history.

(56) References Cited

U.S. PATENT DOCUMENTS

| 5,731,856 A | * | 3/1998 | Kim | ...................... G02F 1/1345 |
| | | | | 349/147 |
| 6,580,127 B1 | * | 6/2003 | Andry | ...................... H01L 27/12 |
| | | | | 257/347 |

(Continued)

FOREIGN PATENT DOCUMENTS

| CN | 102468232 A | 5/2012 |
| CN | 102651402 A | 8/2012 |

(Continued)

OTHER PUBLICATIONS

Search Report and Written Opinion for International Patent Application No. PCT/CN2017/115620 dated Mar. 14, 2018.
(Continued)

*Primary Examiner* — Vincent Wall
(74) *Attorney, Agent, or Firm* — Calfee, Halter & Griswold LLP

(57) ABSTRACT

A thin film transistor and a method for manufacturing the same, an array substrate and an electronic device. The thin film transistor includes a gate, a gate insulator, an active layer, a source and a drain. A protective structure is disposed on a side of the source and the drain close to the gate.

9 Claims, 6 Drawing Sheets

(51) Int. Cl.
*H01L 29/45* (2006.01)
*H01L 29/66* (2006.01)
*H01L 21/4763* (2006.01)
*H01L 27/12* (2006.01)

(52) U.S. Cl.
CPC .. *H01L 29/66765* (2013.01); *H01L 29/66969* (2013.01); *H01L 29/7869* (2013.01); *H01L 29/78618* (2013.01); *H01L 21/47635* (2013.01); *H01L 27/1225* (2013.01)

(56) References Cited

U.S. PATENT DOCUMENTS

| | | | | |
|---|---|---|---|---|
| 6,620,719 | B1* | 9/2003 | Andry | H01L 29/66765 438/597 |
| 7,791,075 | B2* | 9/2010 | Kobayashi | H01L 29/78696 257/59 |
| 9,576,984 | B1* | 2/2017 | Shih | H01L 21/441 |
| 2001/0017371 | A1* | 8/2001 | Tanaka | H01L 51/5262 257/59 |
| 2004/0119925 | A1* | 6/2004 | Moon | G02F 1/136286 349/139 |
| 2007/0262705 | A1* | 11/2007 | Fukuda | H01L 51/5253 313/504 |
| 2008/0224147 | A1* | 9/2008 | Nagata | H01L 29/78606 257/72 |
| 2008/0258143 | A1* | 10/2008 | Kim | H01L 29/458 257/43 |
| 2009/0011261 | A1* | 1/2009 | Gotou | H01L 27/1255 428/469 |
| 2009/0057672 | A1* | 3/2009 | Kobayashi | H01L 29/78696 257/59 |
| 2010/0072467 | A1* | 3/2010 | Yamazaki | H01L 29/7869 257/43 |
| 2010/0072480 | A1* | 3/2010 | Yoo | H01L 29/66765 257/66 |
| 2011/0092017 | A1* | 4/2011 | Akimoto | H01L 27/1225 438/104 |
| 2011/0114942 | A1* | 5/2011 | Akimoto | H01L 29/45 257/43 |
| 2012/0107983 | A1* | 5/2012 | Choi | H01L 21/77 438/34 |
| 2012/0217500 | A1 | 8/2012 | Park et al. | |
| 2013/0032794 | A1 | 2/2013 | Lee et al. | |
| 2013/0299817 | A1* | 11/2013 | Park | H01L 29/78618 257/43 |
| 2013/0320344 | A1 | 12/2013 | Kim et al. | |
| 2013/0320345 | A1* | 12/2013 | Im | H01L 21/02675 257/59 |
| 2014/0125904 | A1* | 5/2014 | Choung | G02F 1/133345 349/43 |
| 2014/0145196 | A1* | 5/2014 | Chang | H01L 27/124 257/59 |
| 2014/0273341 | A1* | 9/2014 | Van Duren | H01L 27/1225 438/104 |
| 2015/0153779 | A1* | 6/2015 | Ko | G06F 1/1643 345/173 |
| 2015/0263050 | A1 | 9/2015 | Hsu et al. | |
| 2015/0349139 | A1* | 12/2015 | Liu | H01L 21/32051 257/43 |
| 2016/0172508 | A1 | 6/2016 | Lee et al. | |
| 2017/0005198 | A1 | 1/2017 | Zhang et al. | |
| 2017/0090236 | A1* | 3/2017 | Yeh | G02F 1/1368 |
| 2017/0110570 | A1* | 4/2017 | Hou | H01L 29/786 |
| 2018/0108756 | A1 | 4/2018 | Guo et al. | |
| 2019/0013409 | A1* | 1/2019 | Li | H01L 29/78645 |

FOREIGN PATENT DOCUMENTS

| | | |
|---|---|---|
| CN | 102916050 A | 2/2013 |
| CN | 103474431 A | 12/2013 |
| CN | 103715264 A | 4/2014 |
| CN | 104241394 A | 12/2014 |
| CN | 105702740 A | 6/2016 |
| CN | 106876476 A | 6/2017 |
| GN | 103972245 A | 8/2014 |
| GN | 105742186 A | 7/2016 |

OTHER PUBLICATIONS

First Office Action for Chinese Patent Application No. 20170084366.5 dated Apr. 3, 2019.

Second Office Action for Chinese Patent Application No. 201710084366.5 dated Nov. 29, 2019.

* cited by examiner

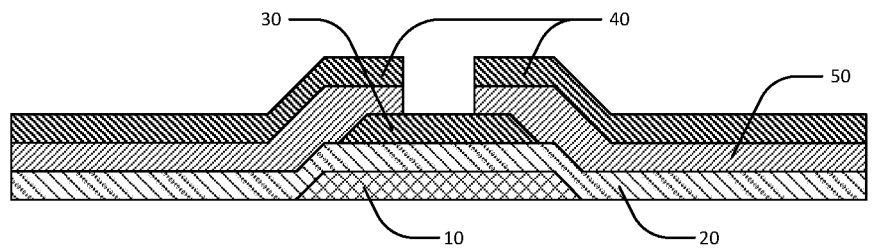
FIG. 1
Error! Objects cannot be created from editing field codes.
FIG. 2
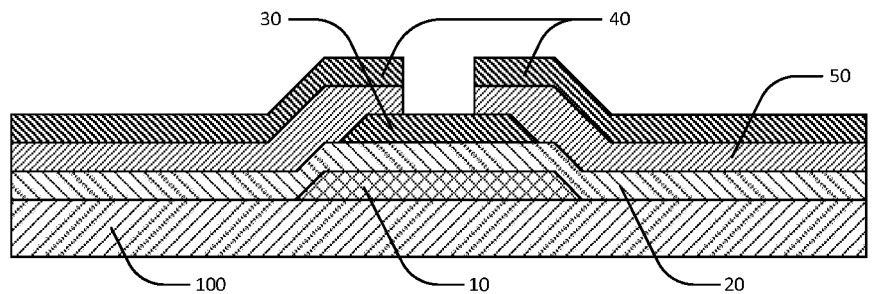
FIG. 3A
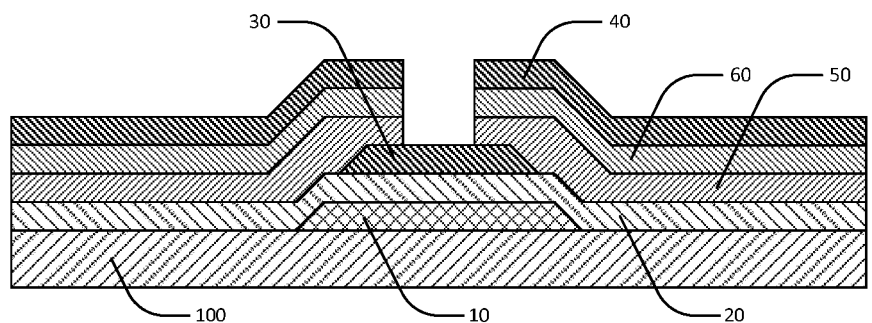
FIG. 3B

THIN FILM TRANSISTOR AND METHOD FOR MANUFACTURING THE SAME, ARRAY SUBSTRATE AND ELECTRONIC DEVICE

CROSS REFERENCE TO RELATED APPLICATIONS

The present application is a 35 U.S.C. § 371 national stage application of PCT International Application No. PCT/CN2017/115620, filed on Dec. 12, 2018, which claims the priority of Chinese patent application No. 201710084366.5 filed on Feb. 16, 2017, the contents of which are incorporated herein by reference in their entireties.

TECHNICAL FIELD

The present disclosure relates to the field of display technology, and in particular to a thin film transistor, an array substrate including the thin film transistor, an electronic device including the array substrate, and a method of manufacturing the thin film transistor.

BACKGROUND

With the development of liquid crystal display technology, the requirement of electron mobility of TFT (thin film transistor) semiconductor layers is becoming higher and higher, and low temperature polysilicon technology (LTPS) has emerged accordingly. LTPS display technology significantly increases pixel write speed, allowing for finer line widths, smaller TFT switches, and higher aperture ratios.

Conventional top-gate LTPS TFT usually requires processes such as LS (shading layer), source/drain doping (S/D doping), and lightly doped drain (Ldd doping). The process is complicated and the cost is high. The bottom gate LTPS TFT does not require an LS layer and doping process, but the problem of damage to the active layer caused by back channel etching and the problem of ohmic contact is difficult to solve.

Therefore, the current thin film transistor process still needs to be improved.

SUMMARY

The embodiments of the present disclosure aim to solve at least one of the technical problems in the related art to some extent.

In an exemplary embodiment of the present disclosure, there is provided a thin film transistor. According to an embodiment, the thin film transistor includes a gate, a gate insulator, an active layer, a source and a drain, wherein a material of the active layer is polysilicon, and a protective structure is disposed on a side of the source and the drain close to the gate and the protective structure is in contact with the active layer.

According to an embodiment, the thin film transistor is a bottom-gate type thin film transistor.

According to an embodiment, a material of the protective structure is oxide semiconductor.

According to an embodiment, a material of the oxide semiconductor is selected from the group consisting of indium gallium zinc oxide, indium zinc oxide and zinc oxide.

According to an embodiment, the thin film transistor further includes an ohmic contact structure disposed between the protective structure and the source and the drain.

According to an embodiment, a material of the ohmic contact structure is N-doped amorphous silicon.

In another exemplary embodiment of the present disclosure, there is provided an array substrate. According to an embodiment, the array substrate includes the thin film transistor according to any one of the embodiments above and a pixel which connects with the drain.

In yet another exemplary embodiment of the present disclosure, there is provided an electronic device. According to an embodiment, the electronic device includes the array substrate according to any one of the embodiments above.

In still another exemplary embodiment of the present disclosure, there is provided a method for manufacturing a thin film transistor. In an embodiment, the method includes steps of:

forming a gate and a gate insulator on a substrate;

forming an active layer, wherein a material of the active layer is polysilicon;

forming a protective layer on a side of the active layer and the gate insulator away from the substrate;

forming an electrode layer on a side of the protective layer away from the substrate;

forming a source and a drain by a first patterning process; and forming a protective structure by a second patterning process.

In an embodiment, the method further includes, between the step of forming the protective layer on the side of the active layer and the gate insulator away from the substrate and the step of forming the electrode layer on the side of the protective layer away from the substrate includes, forming an ohmic contact layer on a side of the protective layer away from the substrate.

In an embodiment, the method further includes, between the step of forming the source and the drain by a first patterning process and the step of forming the protective structure by the second patterning process includes, forming an ohmic contact structure by conducting a third patterning process.

In an embodiment, the step of forming the source and the drain includes wet etching the electrode layer to form the source and the drain; the step of forming the protective structure includes dry etching the ohmic contact layer to form the ohmic contact structure; and the step of forming the protective structure includes wet etching the protective layer to form the protective structure.

BRIEF DESCRIPTION OF DRAWINGS

FIG. 1 shows a schematic structural view of a thin film transistor according to an embodiment of the present disclosure.

FIG. 2 shows a schematic structural view of a thin film transistor according to another embodiment of the present disclosure.

FIG. 3A and FIG. 3B show schematic structural views of a thin film transistor according to yet another embodiment of the present disclosure.

DETAILED DESCRIPTION

Figure 4:
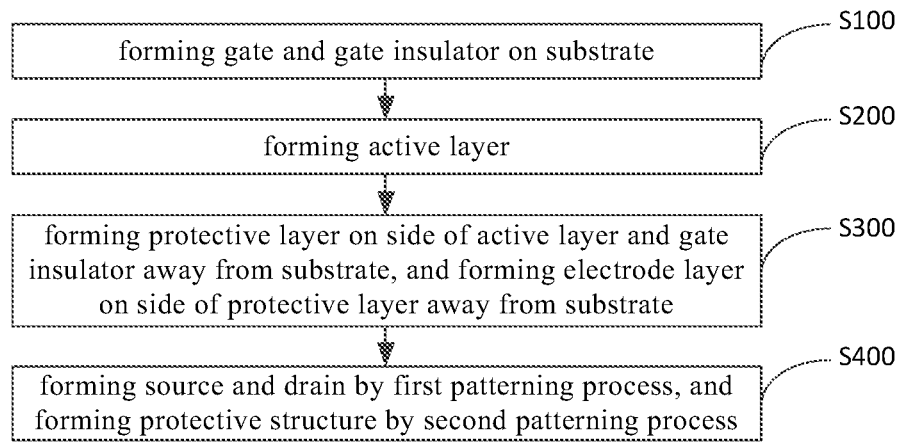
FIG. 4 shows a schematic flow diagram of a method for manufacturing a thin film transistor according to an embodiment of the present disclosure.

Embodiments of the present disclosure are described in detail below. The embodiments described below are exemplary. They are only used to explain the present disclosure and cannot be understand as limitations to the present disclosure. Embodiments whose specific techniques or conditions are not indicated are carried out according to the techniques or conditions described in the literature in the art or in accordance with the product specifications. Any reagent or instrument that is not indicated with its manufacturer is commercially available.

In an exemplary embodiment of the disclosure, it is provided a thin film transistor. According to an embodiment of the present disclosure, referring to FIG. 1, the thin film transistor includes a gate 10, a gate insulator 20, an active layer 30, a source 40 and a drain 40. The material of the active layer 30 is polysilicon. A protective structure 50 is disposed on a side of the source 40 and the drain 40 close to the gate 10. The protective structure is in contact with the active layer 30. The inventors have found that, by disposing the protective structure (that can be obtained by wet etching process) on the side of the source and the drain close to the gate, and in contact with the active layer, the damage to the active layer during the etching process can be avoided, and the channel of the active layer would not be etched. Meanwhile, the protective structure can reduce the contact resistance, which can greatly improve the electrical performance of the thin film transistor.

According to an embodiment of the present disclosure, the specific structure of the thin film transistor is not particularly limited. It may be the structure of a conventional thin film transistor in the art, for example, including but not limited to a bottom-gate type thin film transistor or a top-gate type thin film transistor. In some preferred embodiments of the present disclosure, referring to FIG. 1, the thin film transistor is a bottom-gate type thin film transistor. The bottom-gate type thin film transistor has a huge advantage in terms of process and cost because the doping process and the shield layer process can be omitted.

According to an embodiment of the present disclosure, the material forming the protective structure is not particularly limited, as long as the active layer can be protected from being damaged during the etching process and the protective structure can be removed by a wet etching process. In some embodiments of the present disclosure, the material of the protective structure is an oxide semiconductor. Therefore, the effect of preventing the active layer from being damaged is better, and the protective structure can be effectively removed by a wet etching process without causing etching of the active layer.

According to an embodiment of the present disclosure, the specific kind of the oxide semiconductor is not particularly limited either, and those skilled in the art can flexibly select according to needs. In some embodiments of the present disclosure, oxide semiconductors that may be employed include, but are not limited to, at least one of indium gallium zinc oxide (IGZO), indium zinc oxide (IZO) and zinc oxide. Thereby, the oxide semiconductor has a good protective effect and is easily removed by wet etching.

According to an embodiment of the present disclosure, referring to FIG. 2, the thin film transistor further includes an ohmic contact structure 60 disposed between the protective structure 50 and the source 40 and the drain 40. It should be noted that the source and the drain should be understand as a structure which includes two portions. Any one of the two portions can be recognized as the source, and the rest one is recognized as the drain. Therefore, the ohmic contact structure disposed between the protective structure 50 and the source 40 and the drain 40" should be understand as being disposed between the protective structure and the structure including the source and the drain. In other words, a portion of the ohmic contact structure is disposed between the protective structure 50 and the source 40, and another portion of the ohmic contact structure is disposed between the protective structure 50 and the drain 40 at the same time. The inventors have found that, by providing the ohmic contact structure, the contact resistance can be further reduced, the turn-on current $I_{on}$ can be increased, and the leakage current $I_{off}$ can be reduced. In particular, when the gate is under negative voltage, the electrons in the active layer are depleted, and the hot carriers (holes) are mainly used to conduct electricity. The PN junction formed by the ohmic contact layer may effectively prevent the hole leakage current, which greatly reduce the leakage current.

According to an embodiment of the present disclosure, the specific material forming the ohmic contact structure is not particularly limited, as long as it may effectively reduce the contact resistance, increase the turn-on current, and reduce the leakage current. In some embodiments of the present disclosure, the material forming the ohmic contact structure is a heavily doped n-type amorphous silicon (n+ a-Si). Thereby, the contact resistance is relatively low, the turn-on current is relatively high and the leakage current is greatly reduced.

Those skilled in the art will appreciate that the thin film transistor may further have other structures included in conventional thin film transistors in the art. For example, according to an embodiment of the present disclosure, referring to FIG. 3A and FIG. 3B, the thin film transistor may further includes a substrate 100 to provide support for the thin film transistor.

In another exemplary embodiment of the present disclosure, it is provided an array substrate. According to an embodiment of the present disclosure, the array substrate includes the thin film transistor described above. The array substrate has all features and advantages of the thin film transistor described above, which will not be further described herein.

Those skilled in the art can understand that, in addition to the above thin film transistor, the array substrate of the present disclosure also includes other necessary structures and components of a conventional array substrate, such as gate lines, data lines, and necessary circuit structures, etc. For example, the array substrate may further include a pixel electrode which may connect with the drain.

In yet another exemplary embodiment of the present disclosure, it is provided an electronic device. According to an embodiment of the present disclosure, the electronic device includes the array substrate described above. The electronic device has all features and advantages of the array substrate described above which will not be further described herein.

According to an embodiment of the present disclosure, the specific kind of the electronic device is not particularly limited and the electronic device may be any electronic device provided with an array substrate. In some embodiments of the present disclosure, the electronic device includes, but is not limited to, any product or component having a display function, such as a mobile phone, a tablet, a television, a display, a laptop computer, a digital photo frame, a navigator, and the like.

Those skilled in the art will appreciate that, in addition to the array substrate previously described, the electronic device also includes other necessary structures and components of a conventional electronic device. For example, taking a display panel as an example, the electronic device further includes an array substrate, a color film substrate, liquid crystal filled between the array substrate and the color film substrate, a backlight module, and the like.

In again another exemplary embodiment of the present disclosure, it is provided a method of manufacturing the thin film transistor described above. According to an embodiment of the present disclosure, referring to FIG. 4, the method may include the following steps:

S100: forming a gate and a gate insulator on a substrate.

Specifically, this step may be conducted by means of any method for forming a gate and a gate insulator known in the art. For example, the method may include, but not limited to, forming a gate and a gate insulator by physical vapor deposition or chemical vapor deposition, which specifically may be vacuum sputtering, deposition or other method. It will be understood by those skilled in the art that in this step, the gate and the gate insulator may be formed directly at predetermined positions, or a complete layer structure may be formed on the substrate firstly, and then patterned by etching or other process. In addition, this step may also include steps such as doping.

According to an embodiment of the present disclosure, the materials of the substrate, the gate, and the gate insulator are not particularly limited, and they may be formed by materials conventional in the art. For example, the substrate includes, but is not limited to, a glass substrate, the gate may be a metal gate, etc., and the material forming the gate insulator may be a polymer, an oxide, or the like.

S200: forming an active layer.

Specifically, in this step, a layer structure covering the gate insulator may be formed firstly, and then the active layer satisfying the requirements is formed by patterning or the like. The method for forming the active layer may be physical vapor deposition or chemical vapor deposition, and specifically may be vacuum sputtering, deposition, or the like.

According to an embodiment of the present disclosure, the material forming the active layer may be polysilicon. Thus, the thin film transistor has good electrical properties. Specifically, an amorphous silicon layer may be formed on the upper surface of the gate insulator in advance, and then the amorphous silicon layer is converted into a polysilicon layer by an excimer laser crystallization process, and then the active layer is obtained by a patterning process.

S300: forming a protective layer on a side of the active layer and the gate insulator away from the substrate, and forming an electrode layer on a side of the protective layer away from the substrate.

According to an embodiment of the present disclosure, the protective layer and the electrode layer may be formed by a physical vapor deposition process or a chemical vapor deposition process. The material forming the protective layer may be oxide semiconductor, which specifically include, but is not limited to, at least one of indium gallium zinc oxide, indium zinc oxide, and zinc oxide. Thereby, it has a good protective effect and is easy to be removed by wet etching. The material forming the electrode layer can be any material that can form a source or a drain in the art. It can be selected by those skilled in the art as needed.

According to an embodiment of the present disclosure, in this step, the protective layer and the electrode layer may be formed by physical vapor deposition or chemical vapor deposition, which for example includes, but is not limited to, vacuum sputtering, deposition, or the like.

S400: forming a source and a drain by a first patterning process and forming a protective structure by a second patterning process.

According to an embodiment of the present disclosure, in this step, the electrode layer and the protective layer are etched by wet etching process, which will not damage the active layer and effectively improves the electrical properties of the thin film transistor.

The inventor has found that the thin film transistor described above can be obtained quickly and effectively by this method. Further, since the protective structure is formed on the side of the source and the drain close to the gate, the protective structure can be obtained by the wet etching process, thereby effectively avoiding the damage to the active layer in the dry etching process so that the active layer will not be eroded. Meanwhile, the protective structure can reduce the contact resistance which greatly improves the electrical property of the thin film transistor.

According to an embodiment of the present disclosure, the material of the active layer is polysilicon. Therefore, the active layer will not be damaged during the wet etching process, and can be ideally protected by the protective layer in the dry etching process, and the electrical properties of the thin film transistor are significantly improved.

Figure 5:
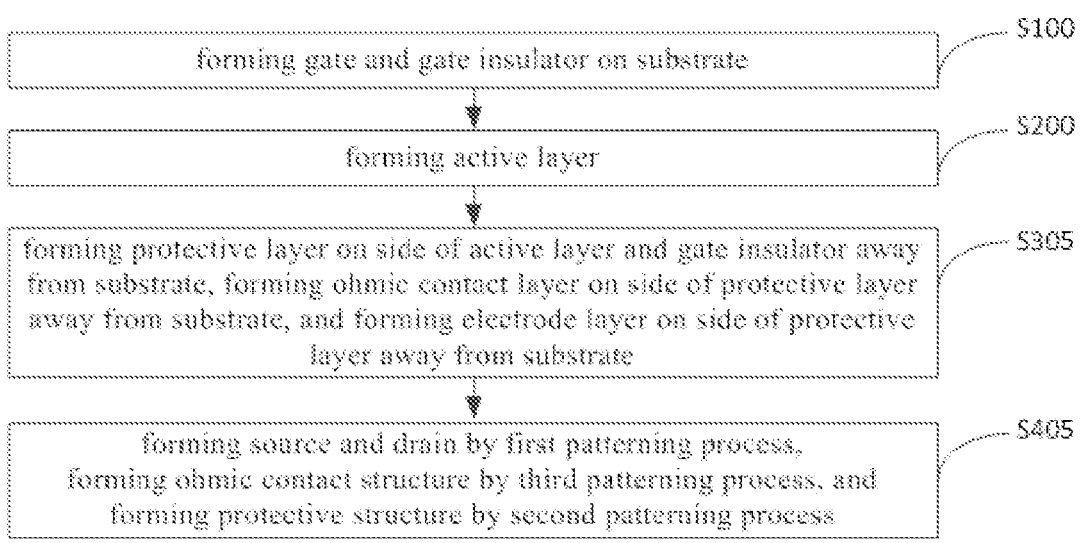
FIG. 5 shows a schematic flow diagram of a method of manufacturing a thin film transistor according to another embodiment of the present disclosure.

According to an embodiment of the present disclosure, referring to FIG. 5, in step S305, the protective layer is formed on the side of the active layer and the gate insulator away from the substrate, the ohmic contact layer is formed on a side of the protective layer away from the substrate, and the electrode layer is formed on the side of the protective layer away from the substrate; in step 405, the source and the drain is formed by a first patterning process, the ohmic contact structure is formed by a third patterning process, and the protective structure is formed by a second patterning process. The inventor has found that, by providing the ohmic contact structure, the contact resistance can be further reduced, the turn-on current can be increased, and the leakage current can be reduced. In particular, when the gate is under negative voltage, the electrons in the active layer are depleted, and the electricity is mainly conducted by means of the hot carriers (holes). The PN junction formed by the ohmic contact layer can effectively prevent the hole leakage current, which greatly reduce leakage current.

According to an embodiment of the present disclosure, the material forming the ohmic contact layer may be a N-doped amorphous silicon. Thereby, the contact resistance is relatively low, the turn-on current is relatively high, and the leakage current is greatly reduced.

Figure 6:
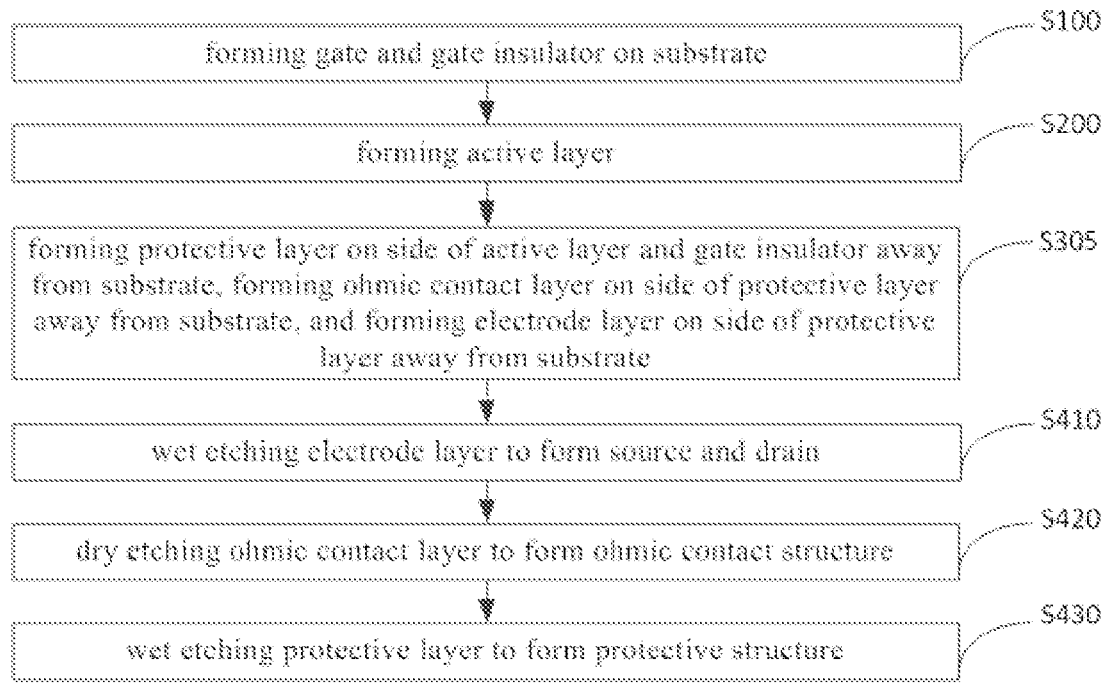
FIG. 6 shows a schematic flow diagram of a method of manufacturing a thin film transistor according to yet another embodiment of the present disclosure.

According to an embodiment of the present disclosure, referring to FIG. 6, a source and a drain is formed by a first patterning process, an ohmic contact structure is formed by a third patterning process, and a protective structure is formed by a second patterning processes, which includes: S410: wet etching the electrode layer to form the source and the drain; S420: dry etching the ohmic contact layer to form the ohmic contact structure; S430: wet etching the protective layer to form the protective structure.

Specifically, the electrode layer may be etched by wet etching process, and then the ohmic contact layer is etched by dry etching process. Then, the protective layer is etched by wet etching process. In the step of etching the ohmic contact layer by dry etching process, due to the presence of the protective layer, the active layer can be effectively prevented from being damaged in the dry etching, and the protective layer can be patterned by wet etching process without eroding the active layer, thereby greatly improve the electrical properties of the thin film transistor.

Figure 7A:
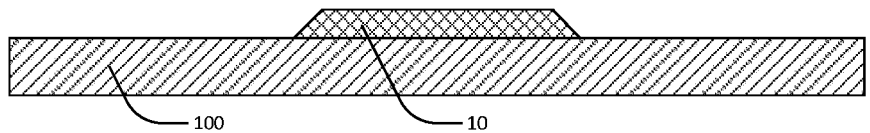
FIG. 7A, FIG. 7B, FIG. 7C, FIG. 7D, and FIG. 7E show schematic flow diagrams of a method of manufacturing a thin film transistor according to still another embodiment of the present disclosure.
Figure 7B:
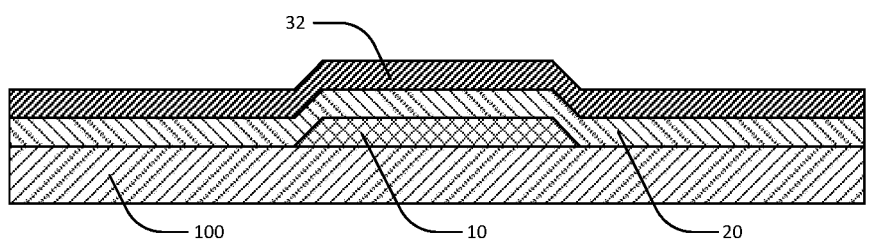
Figure 7C:
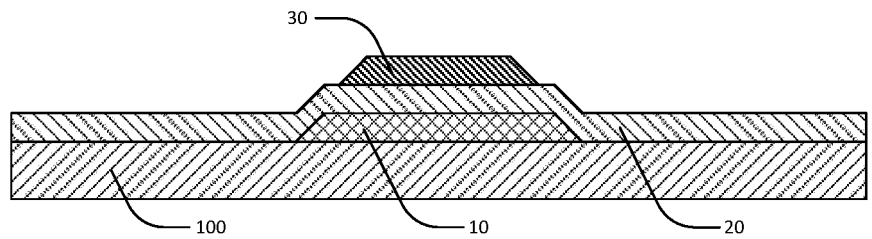
Figure 7D:
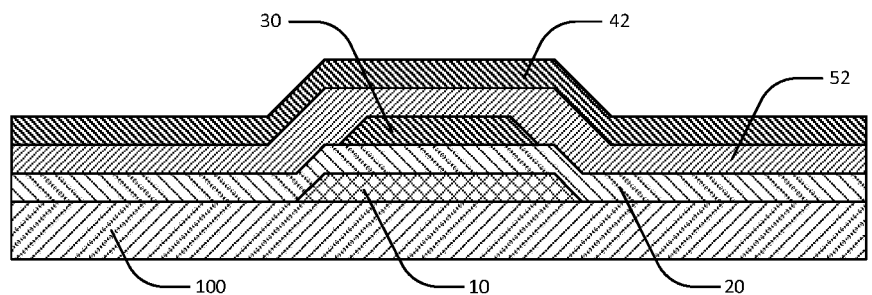
Figure 7E:
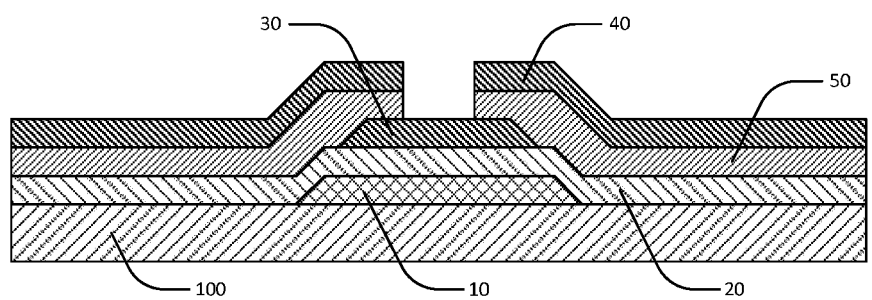

In a specific example of the present disclosure, referring to FIGS. 7A-7E, the method for manufacturing the thin film transistor includes:

forming a gate 10 on the substrate 100, as shown in FIG. 7A;

sequentially forming a gate insulator 20 and an amorphous silicon layer on the upper surfaces of the substrate 100 and the gate 10, conducting an excimer laser crystallization treatment to the amorphous silicon layer to form a polysilicon layer 32, as shown in FIG. 7B;

patterning the polysilicon layer 32 to form an active layer 30, wherein the area of the orthographic projection of the active layer 30 on the gate 10 is smaller than the area of the gate 10, as shown in FIG. 7C;

sequentially forming a protective layer 52 and an electrode layer 42 on upper surfaces of the active layer 30 and the gate insulator 20, as shown in FIG. 7D;

conducting wet etching to the protective layer 52 and the electrode layer 42 to form a protective structure 50 and a source 40 and a drain 40, as shown in FIG. 7E, then a thin film transistor is obtained.

Figure 8A:
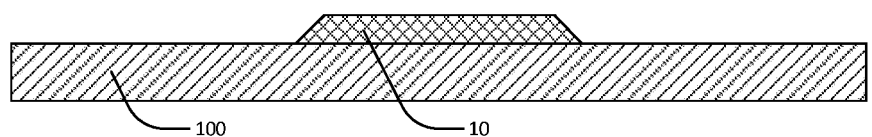
FIG. 8A, FIG. 8B, FIG. 8C, FIG. 8D, FIG. 8E, FIG. 8F, and FIG. 8G show schematic flow diagrams of a method of manufacturing a thin film transistor according to yet again another embodiment of the present disclosure.
Figure 8B:
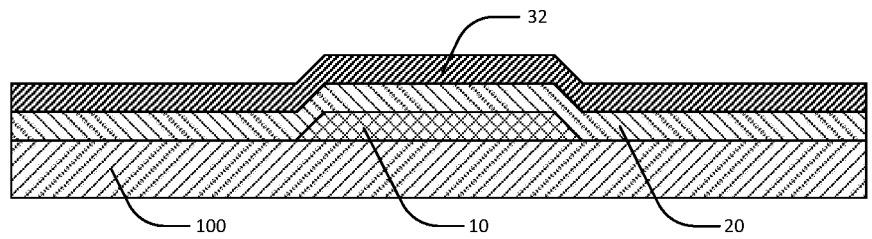
Figure 8C:
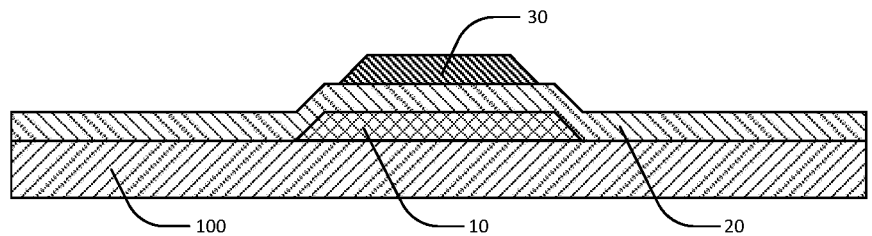
Figure 8D:
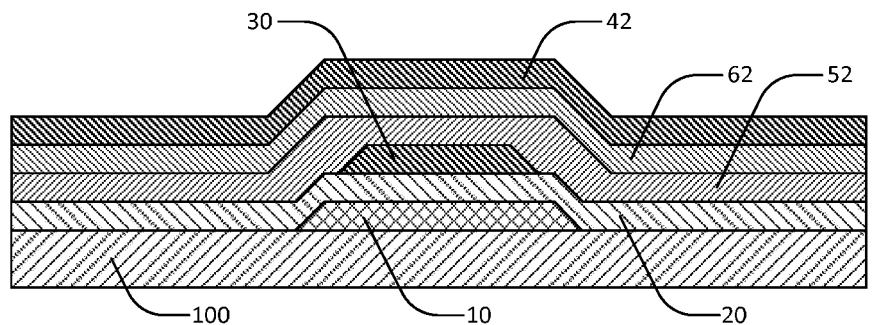
Figure 8E:
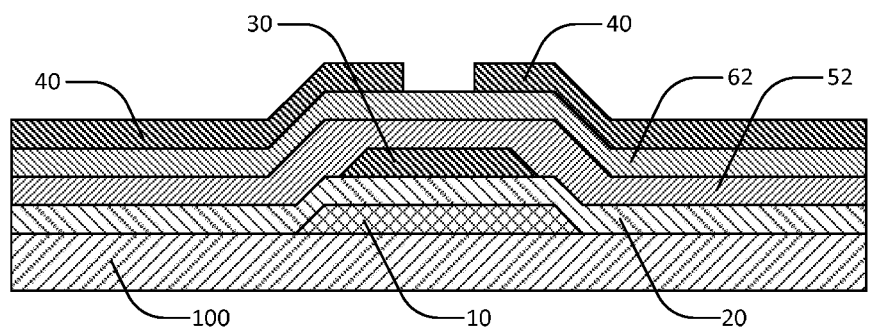
Figure 8F:
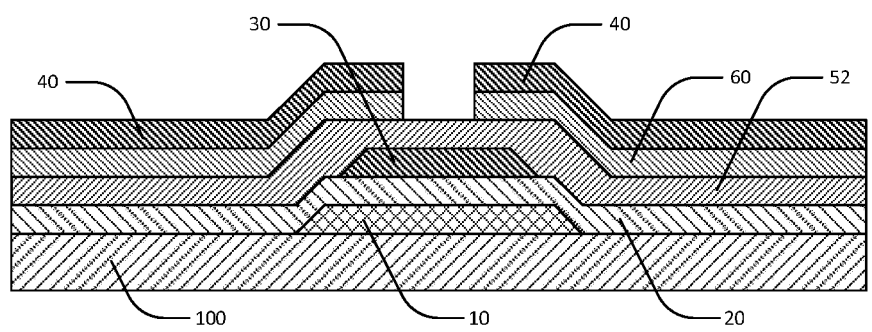
Figure 8G:
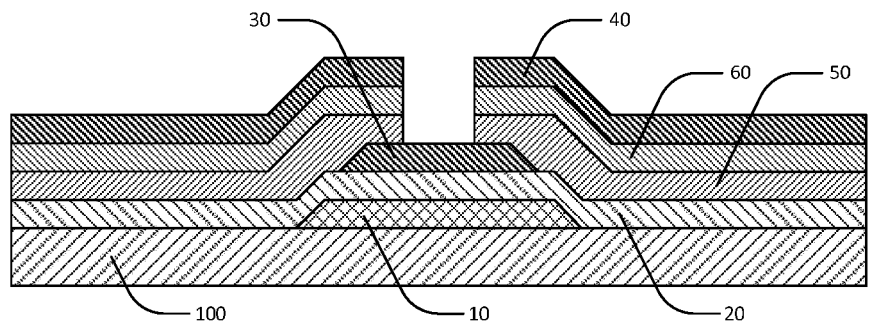

According to a specific example of the present disclosure, referring to FIGS. 8A-8G, a method for manufacturing a thin film transistor includes:

forming a gate 10 on the substrate 100, as shown in FIG. 8A;

sequentially forming a gate insulator 20 and an amorphous silicon layer on upper surfaces of the substrate 100 and the gate 10, and conducting an excimer laser crystallization treatment to the amorphous silicon layer to form a polysilicon layer 32, as shown in FIG. 8B;

patterning the polysilicon layer 32 to form an active layer 30, wherein the area of the orthographic projection of the active layer 30 on the gate 10 is smaller than the area of the gate 10, as shown in FIG. 8C;

sequentially forming a protective layer 52, an ohmic contact layer 62 and an electrode layer 42 are on the upper surfaces of the active layer 30 and the gate insulator 20, as shown in FIG. 8D;

etching the electrode layer 42 by wet etching to form a source 40 and a drain 40, as shown in FIG. 8E;

etching the ohmic contact layer 62 by dry etching to form an ohmic contact structure 60, as shown in FIG. 8F;

etching the protective layer 52 by wet etching to form a protective structure 50, as shown in FIG. 8G, then the thin film transistor is obtained.

In the description of the present specification, the terms "an embodiment", "some embodiments", "example", "specific example", or "some examples" and the like means that a specific feature, structure, material or characteristics described in connection with the embodiment or example is included in at least one embodiment or example of the present disclosure. In the present specification, the schematic representation of the above terms is not necessarily directed to the same embodiment or example. Furthermore, the particular features, structures, materials, or characteristics may be combined in a suitable manner in any one or more embodiments or examples. In addition, various embodiments or examples described in the specification, as well as features thereof, described in the present specification may be combined by those skilled in the art.

While the embodiments of the present disclosure have been shown and described above, it is understood that the above-described embodiments are illustrative and are not to be construed as limitation to the disclosure. Variations, modifications and alterations of the above-described embodiments may be made by those skilled in the art within the scope of the present disclosure.

We claim:

1. A thin film transistor comprising a gate, a gate insulator, an active layer, a source and a drain,
    wherein a material of the active layer is polysilicon, and a protective structure is disposed on a side of the source and the drain close to the gate and the protective structure is in contact with the active layer, and
    an ohmic contact structure disposed between the protective structure and the source and the drain,
    wherein a material of the ohmic contact structure is an N-doped amorphous silicon,
    wherein a material of the protective structure is an oxide semiconductor, and
    wherein a material of the oxide semiconductor is selected from a group consisting of indium gallium zinc oxide, indium zinc oxide and zinc oxide.

2. The thin film transistor according to claim 1, wherein the thin film transistor is a bottom-gate type thin film transistor.

3. The thin film transistor according to claim 2, further comprising an ohmic contact structure disposed between the protective structure and the source and the drain.

4. An array substrate, comprising a thin film transistor, wherein the thin film transistor comprises a gate, a gate insulator, an active layer, a source and a drain,
    wherein a material of the active layer is polysilicon, and a protective structure is disposed on a side of the source and the drain close to the gate and the protective structure is in contact with the active layer, and
    an ohmic contact structure disposed between the protective structure and the source and the drain,
    wherein a material of the ohmic contact structure is N-doped amorphous silicon, and
    wherein a material of the protective structure is an oxide semiconductor, and wherein a material of the oxide semiconductor is selected from a group consisting of indium gallium zinc oxide, indium zinc oxide and zinc oxide.

5. The array substrate according to claim 4, wherein the thin film transistor is a bottom-gate type thin film transistor.

6. A method for manufacturing a thin film transistor, comprising steps of:
    forming a gate and a gate insulator on a substrate;
    forming an active layer, wherein a material of the active layer is polysilicon;
    forming a protective layer on a side of the active layer and the gate insulator away from the substrate, wherein a material of the protective structure is an oxide semiconductor, and wherein a material of the oxide semiconductor is selected from a group consisting of indium gallium zinc oxide, indium zinc oxide and zinc oxide;
    forming an electrode layer on a side of the protective layer away from the substrate;
    forming a source and a drain by a first patterning process;
    forming an ohmic contact structure disposed between the protective structure and the source and the drain, wherein a material of the ohmic contact structure is N-doped amorphous silicon; and forming a protective structure by a second patterning process.

7. The method for manufacturing the thin film transistor according to claim 6, further comprising, between the step of forming the protective layer on the side of the active layer and the gate insulator away from the substrate and the step of forming the electrode layer on the side of the protective layer away from the substrate, forming an ohmic contact layer on a side of the protective layer away from the substrate.

8. The method for manufacturing the thin film transistor according to claim 7, further comprising, between the step of forming the source and the drain by the first patterning process and the step of forming the protective structure by the second patterning processes, forming an ohmic contact structure by conducting a third patterning process to the ohmic contact layer.

9. The method for manufacturing the thin film transistor according to claim 8, wherein the step of forming the source and the drain comprises wet etching the electrode layer to form the source and the drain; the step of forming the protective structure comprises dry etching the ohmic contact layer to form the ohmic contact structure; and the step of forming the protective structure comprises wet etching the protective layer to form the protective structure.

* * * * *